(12) United States Patent
Ruggeri et al.

(10) Patent No.: US 7,663,294 B2
(45) Date of Patent: Feb. 16, 2010

(54) ENHANCED DISPLACEMENT PIEZOELECTRIC MOTOR

(75) Inventors: Robert T Ruggeri, Kirkland, WA (US); Dan J Clingman, Auburn, WA (US)

(73) Assignee: The Boeing Company, Chicago, IL (US)

( * ) Notice: Subject to any disclaimer, the term of this patent is extended or adjusted under 35 U.S.C. 154(b) by 547 days.

(21) Appl. No.: 11/584,305

(22) Filed: Oct. 20, 2006

(65) Prior Publication Data

US 2008/0100179 A1 May 1, 2008

(51) Int. Cl.
H01L 41/04 (2006.01)
H01L 41/08 (2006.01)
(52) U.S. Cl. ........................... 310/330; 310/328
(58) Field of Classification Search .......... 310/330–332
See application file for complete search history.

(56) References Cited

U.S. PATENT DOCUMENTS

| | | | |
|---|---|---|---|
| 3,456,134 A | | 7/1969 | Ko |
| 5,266,863 A | * | 11/1993 | Nonami et al. ............... 310/339 |
| 5,751,091 A | | 5/1998 | Takahashi et al. |
| 5,942,837 A | * | 8/1999 | Reuter ........................ 310/328 |
| 6,236,143 B1 | | 5/2001 | Lesieutre et al. |
| 6,294,859 B1 | * | 9/2001 | Jaenker ....................... 310/328 |
| 6,320,707 B1 | * | 11/2001 | Khoshnevisan et al. ...... 359/824 |
| 6,392,329 B1 | * | 5/2002 | Bryant et al. ................ 310/328 |
| 6,407,484 B1 | * | 6/2002 | Oliver et al. ................. 310/339 |
| 6,847,155 B2 | * | 1/2005 | Schwartz et al. ............. 310/328 |
| 6,858,970 B2 | | 2/2005 | Malkin et al. |
| 6,894,460 B2 | | 5/2005 | Clingman |
| 7,446,459 B2 | * | 11/2008 | Xu et al. ...................... 310/339 |
| 7,498,728 B2 | * | 3/2009 | Albert ......................... 310/370 |

FOREIGN PATENT DOCUMENTS

WO  WO 02/086981  10/2002

OTHER PUBLICATIONS

Post-Buckled Precompressed (PBP) Actuators: Enhancing VTOL Autonomous High Speed MAVs by Ron Barrett; 46th AIAA/ASME/ASCE/AHS/ASC Structures, Structural Dynamics & Materials Conference Apr. 18-21, 2005, Austin, Texas.

(Continued)

Primary Examiner—J. SanMartin
(74) Attorney, Agent, or Firm—Harness, Dickey & Pierce, P.L.C.

(57) ABSTRACT

A mechanical energy generating apparatus is provided. The apparatus includes a shape changing flexure beam connected at opposing distal ends to first lever arms of a pair of opposing tilt connectors. The apparatus additionally includes a bias beam connected at opposing ends to second lever of the tilt connectors. The tilt connectors are pivotally connected to an adjustable length base such that a distance between the tilt connectors can be adjusted to flex the bias beam and exert a force on the second lever arms of the tilt connectors. The force exerted by the bias beam is transferred to the first lever arms and flexes the flexure beam to approximately a critical buckling stress point of the flexure beam. The flexure beam has a center portion configured to oscillate between a first displacement position beyond the critical buckling stress point, in a first direction, and a second displacement position beyond the buckling stress point, in the an opposing second direction, in response to an oscillating energy field applied across the flexure beam.

22 Claims, 8 Drawing Sheets

OTHER PUBLICATIONS

Active Structures Using Buckling Beam Actuators by Eric M. Mockensturm; Jie Jiang; 44th AIAA/ASME/ASCE/AHS Structures, Structural Dynamics, and Materials Conference; Apr. 7-10, 2003, Norfolk, Virginia.

Improvement of actuation displacement of LIPCA implementing bifurcation phenomena by Quoc Viet Nguyen, Seungsik Lee, Hoon Cheol Park; Smart Structures and Materials 2006; Active Materials: Behavior and Mechanics, edited by William D. Armstrong, Proc. of SPIE vol. 6170, 6170L, (2006).

"Can a Coupling Coefficient of a Piezoelectric Device Be Higher Than Those of Its Active Material?" by George A. Lesieutre and Christopher L. Davis; reprinted from Journal of Intelligent Material Systems and Structures, vol. 8—Oct. 1997.

A Centrally-Clamped Parallel-Beam Bistable MEMS Mechanism by Jin Qiu, Jeffrey H. Lang, Alexander H. Slocum; 0-7803-5998-4/1/ $10.00@2001IEEE.

A Curved-Beam Bistable Mechanism by Jin Qiu, Jeffrey H. Lang, Alexander H. Slocum; 1057-7157/04$20.00 copyright 2004IEEE.

Ibong Jung, Yongrae Roh, "Design and fabrication of piezoceramic bimorph vibration sensors", 1998.

* cited by examiner

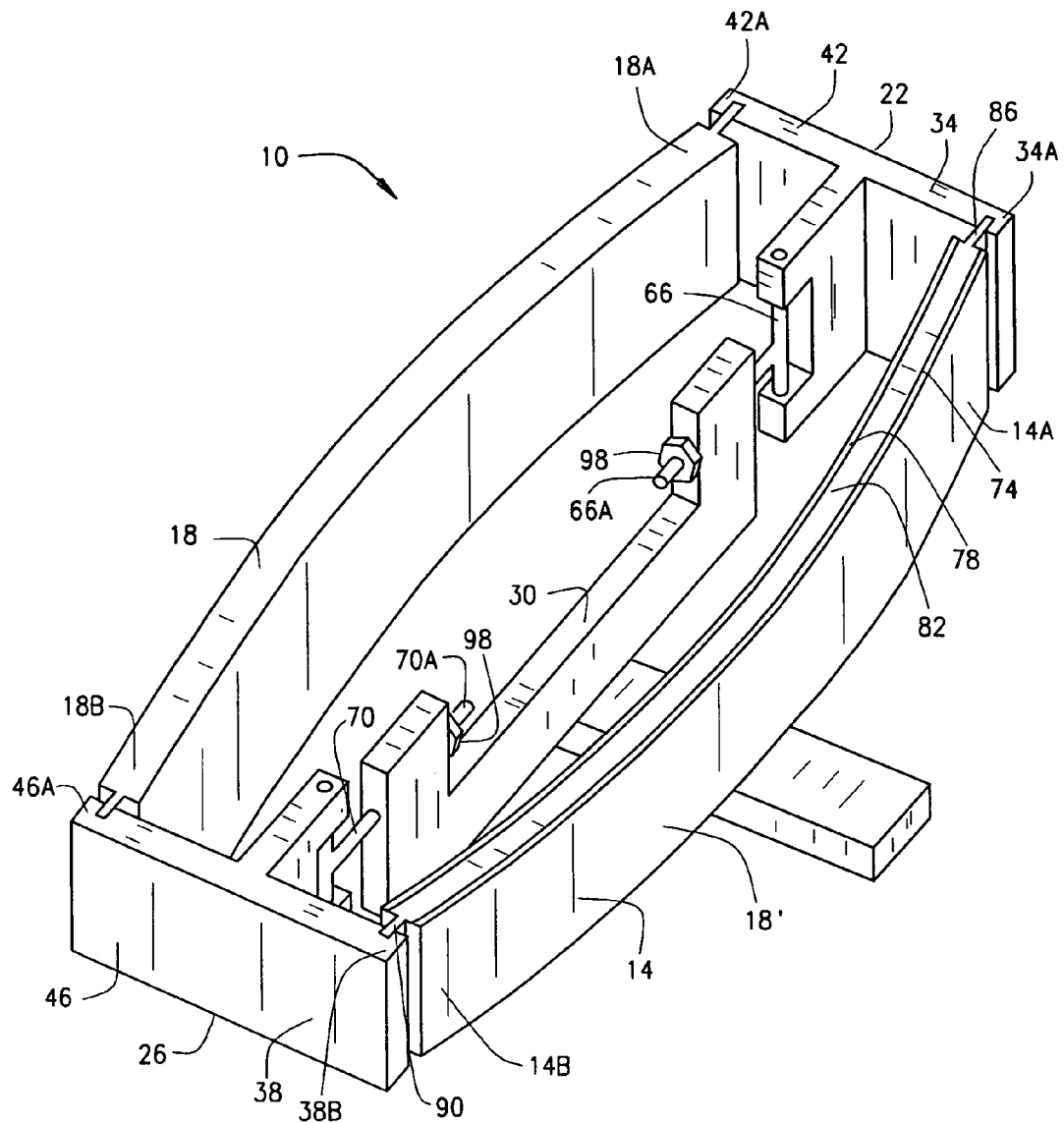
F I G . 2

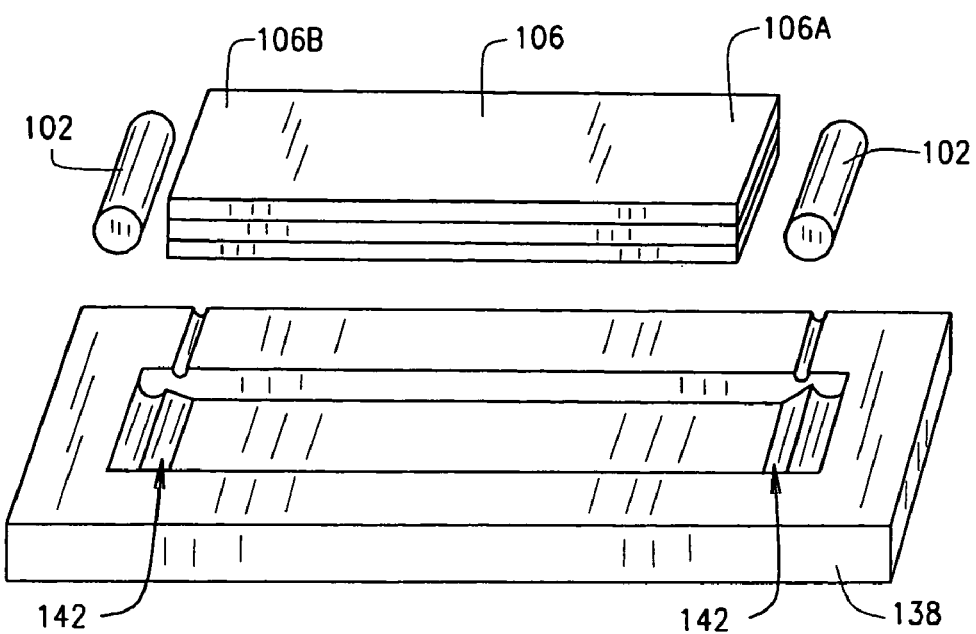
F I G. 9
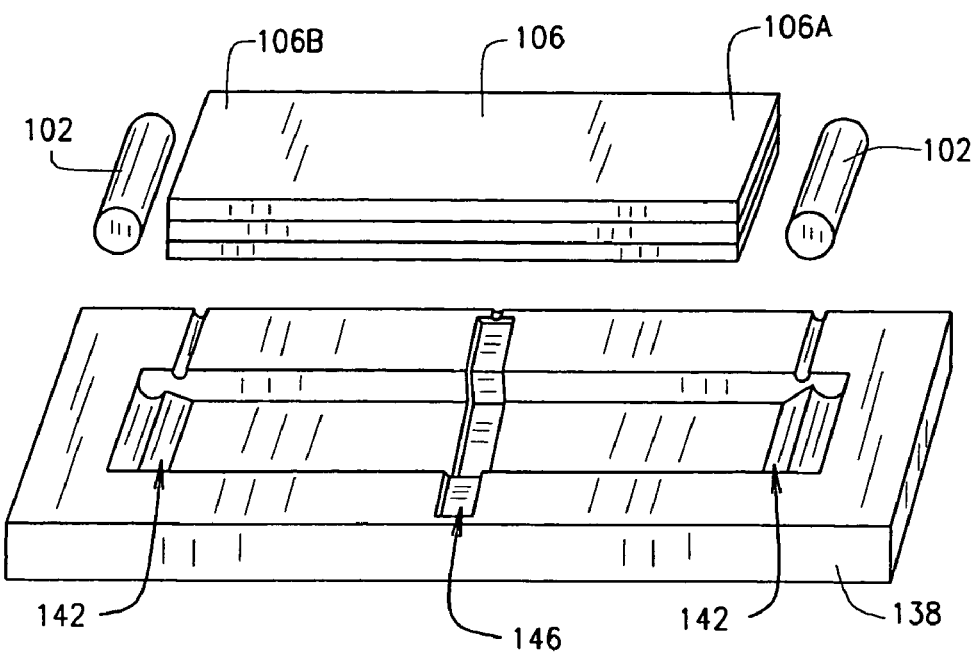
F I G. 10

ENHANCED DISPLACEMENT PIEZOELECTRIC MOTOR

CROSS-REFERENCE TO RELATED APPLICATIONS

The present application is related in general subject matter to the following applications, each of which being filed concurrently with the present application, and each of which is hereby incorporated by reference into the present application: U.S. application Ser. Nos. 12/203,382; 11/551,388; 11/584,304; and 11/515,525.

FIELD

The present teachings relate to motors that utilize shape changing materials to generate mechanical energy deliverable to a mechanical device.

BACKGROUND

The statements in this section merely provide background information related to the present disclosure and may not constitute prior art.

Piezoelectric devices are often used in small, compact, light-weight motor applications to provide mechanical energy that can be used to generate mechanical work. Generally, a voltage is applied to a structure, e.g., a beam, comprising a piezoelectric material that causes the piezoelectric structure to flex or bow. For example, a piezoelectric beam can comprise piezoelectric layers formed on opposite sides of a flexible supporting substrate. In such instances, the voltage is applied across one of the piezoelectric layers causing this first layer to elongate, while substantially simultaneously, a reverse voltage is applied across the other piezoelectric layer causing the second layer to shorten. Thus, the beam is caused to bow or flex, resulting in a physical displacement of at least a portion of the beam. This displacement can be utilized to provide mechanical work. For example, the polarity of the applied voltages can be cyclically alternated such that the portion of the piezoelectric beam that is displaced oscillates between displacement in a first direction and displacement in an opposite second direction. This oscillating displacement can be utilized to provide mechanical energy, or work. For example, the oscillating displacement can be used to drive a piston of a pneumatic device.

However, for the typical piezoelectric motor device to work efficiently, the cyclic frequency of the alternating voltage must occur at or above the resonance frequency of the piezoelectric beam that is determined by the material characteristics of the beam. That is, the stiffness of the beam, including the piezoelectric material, and beam length determine how quickly and how much the beam will flex when voltage is applied. Oscillation of the applied voltage, and therefore oscillation of the beam, at frequency below the resonance frequency will produce very little displacement of the piezoelectric beam. Conversely, voltage and beam oscillation at or above the resonance frequency will provide maximum displacement. However, the material characteristics of the beam typically require that a considerable amount of electrical energy be provided to overcome the stiffness of the beam and cause the beam to flex. This typically limits the oscillation frequency at which the beam can efficiently provide mechanical energy to a very narrow bandwidth.

Accordingly, there exists a need for a piezoelectric motor that is capable of efficient operation at beam oscillation frequencies above and below the resonance frequency of the piezoelectric beam.

SUMMARY

In accordance with various embodiments, a mechanical energy generating apparatus is provided. The apparatus includes a shape changing flexure beam connected at a first distal end to a first lever arm of a first tilt connector and connected at an opposing second distal end to a first lever arm of a second tilt connector. The apparatus additionally includes a bias beam connected at a first distal end to a second lever arm of the first tilt connector and connected at an opposing second distal end to a second lever arm of the second tilt connector. Furthermore, the apparatus includes a base pivotally connected to the first and second tilt connectors such that a distance between the first and second tilt connectors is adjustable. The adjustability allows the distance between the first and second tilt connectors to be adjusted such that the bias beam is flexed to exert a force on the second lever arms of the first and second tilt connectors. The force exerted by the bias beam is transferred to the first lever arms of the first and second tilt connectors. The transferred force flexes the flexure beam to approximately a critical buckling stress point of the flexure beam. The flexure beam has a center portion configured to oscillate between a first displacement position beyond the critical buckling stress point in a first direction and a second displacement position beyond the buckling stress point in the an opposing second direction in response to an oscillating energy field applied across the flexure beam.

Further areas of applicability of the present teachings will become apparent from the description provided herein. It should be understood that the description and specific examples are intended for purposes of illustration only and are not intended to limit the scope of the present teachings.

DRAWINGS

The drawings described herein are for illustration purposes only and are not intended to limit the scope of the present teachings in any way.

FIG. 2 is an isometric view of the motor, shown in FIG. 1.

FIG. 9 is an isometric view of various components of the piezoelectric bimorph beam shown in FIG. 6 and a portion of an injection molding form, illustrating a method of fabrication of the piezoelectric bimorph beam shown in FIG. 6.

FIG. 10 is an isometric view of various components of the piezoelectric bimorph beam shown in FIG. 7 and a portion of an injection molding form, illustrating a method of fabrication of the piezoelectric bimorph beam shown in FIG. 7.

DETAILED DESCRIPTION

Figure 1:
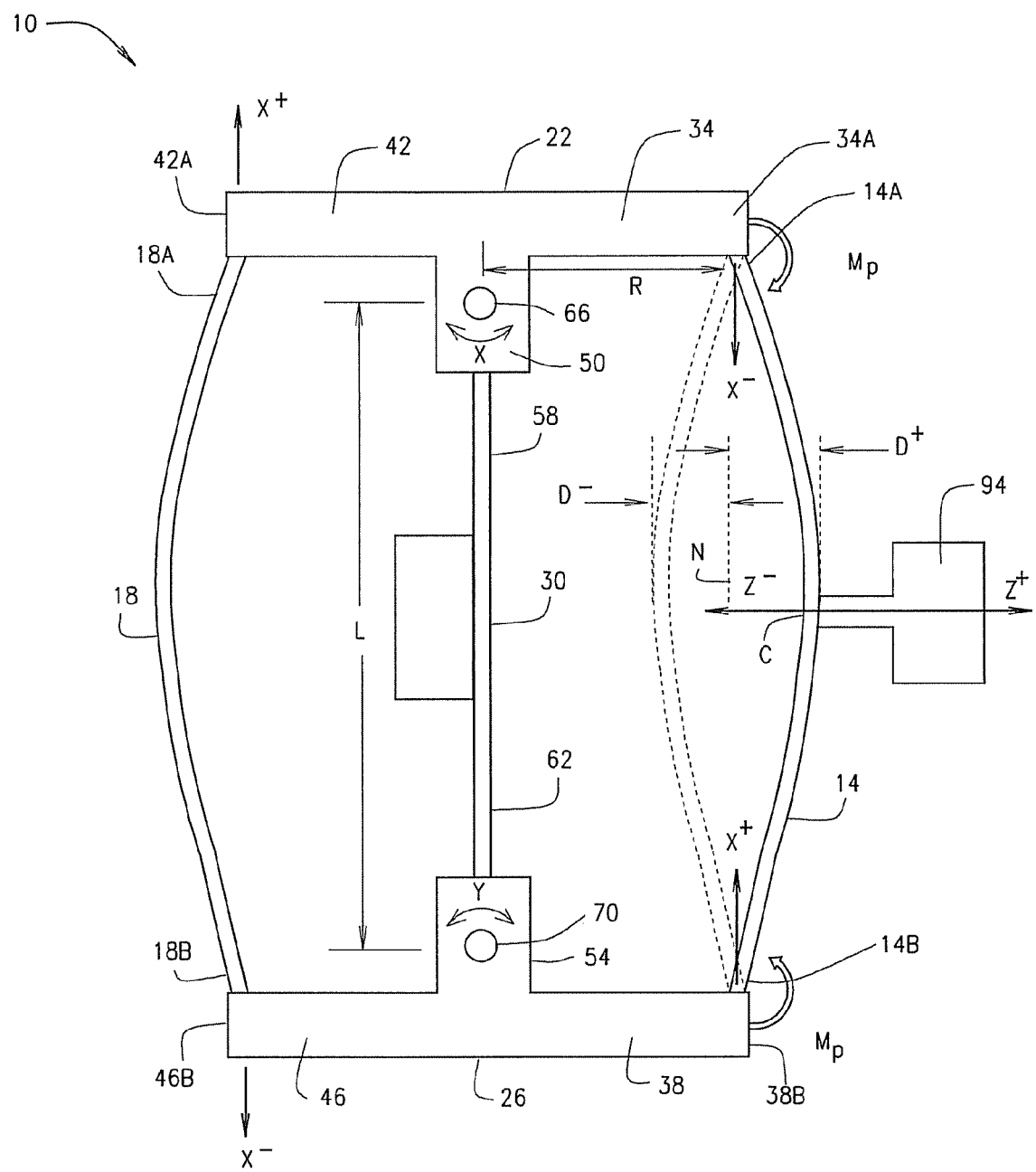
FIG. 1 is a top view, block diagram of a motor including a first flexure beam, in accordance with various embodiments of the present disclosure.

The following description is merely exemplary in nature and is in no way intended to limit the present teachings, application, or uses. Throughout this specification, like reference numerals will be used to refer to like elements.

Referring to FIG. 1, an enhanced displacement motor 10 is provided, in accordance with various embodiments. Generally, the motor 10 includes a bucked flexure beam 14, a bias beam spring 18, a first tilt connector 22, a second tilt connector 26 and a base 30. As used herein, the word 'bucked' is used to mean flexed but not buckled, i.e., not bent, collapsed or folded, more particularly, flexed approximately to, or slightly above, a critical buckling stress point, described further below. The bucked flexure beam 14, herein referred to as the flexure beam 14, includes a first distal end 14A pivotally, or hingedly, coupled to a distal end 34A of a first lever arm 34 of the first tilt connector 22. An opposing second distal end 14B of the flexure beam 14 is pivotally, or hingedly, coupled to a distal end 38B of a first lever arm 38 of the second tilt connector 26. Similarly, the bias beam spring 18, herein referred to as the bias beam 18, includes a first distal end 18A pivotally coupled to a distal end 42A of a second lever arm 42 of the first tilt connector 22. An opposing second distal end 18B of the bias beam 18 is pivotally coupled to a distal end 46B of a second lever arm 46 of the second tilt connector 26. In various embodiments, the first and second lever arms 34 and 42 of the first tilt connector 22, and the first and second lever arms 38 and 46 of the second tilt connector 26 all have substantially equal lengths R. However, in other various embodiments, the first lever arms 34 and 38 of the first and second tilt connectors 22 and 26 have substantially equal lengths R, while the second lever arms 42 and 46 of the first and second tilt connectors 22 and 26 have lengths that are substantially equal to each other but different than the length R of the first lever arms 34 and 38.

The first tilt connector 22 includes a fulcrum point at a center portion, exemplarily illustrated as a fulcrum arm 50 extending from a center portion, between the first and second lever arms 34 and 42, of the first tilt connector 22. Similarly, the second tilt connector 26 includes a fulcrum point at a center portion, exemplarily illustrated as a fulcrum arm 54 extending from a center portion, between the first and second lever arms 34 and 42, of the first tilt connector 22. The fulcrum point, e.g., the fulcrum arm 50, of the first tilt connector 22 is pivotally connected with a first leg 58 of the base 30 and the fulcrum point, e.g., the fulcrum arm 54, of the second tilt connector 26 is pivotally connected with an opposing second leg 62 of the base 30. More particularly, in various embodiments, the base 30 includes a first adjustable pivot axle 66 adjustably carried, or retained, by the base 30 first leg 58, and a second adjustable pivot axle 70 adjustably carried, or retained, by the second leg 62 of base 30. The fulcrum point, e.g., the fulcrum arm 50 of the first tilt connector 22 is pivotally coupled to the first pivot axle 66 and the fulcrum point, e.g., the fulcrum arm 54 of the second tilt connector 26 is pivotally coupled to the second pivot axle 70. Accordingly, the first tilt connector 22 is pivotal at the fulcrum point, e.g., the fulcrum arm 50, about the first pivot axle 66, as indicated by the bidirectional arrow X. Likewise, the second tilt connector 26 is pivotal at the fulcrum point, e.g., the fulcrum arm 54, about the second pivot axle 70, as indicated by the bidirectional arrow Y.

Referring now to FIG. 2, in various embodiments, the flexure beam 14 is a piezo flexure that essentially forms a beam-like structure including piezoelectric layers 74 and 78 formed on opposite sides of a flexible supporting substrate 82. The substrate 82 can be plastic, metal, carbon fiber composite or any other flexible material that allows the piezoelectric layers 74 and 78 to be bonded thereto. For example, in various implementations, the piezo flexure beam 14 includes the substrate 82 comprised of a filled carbon material sandwiched between the two layers 74 and 78 that are comprised of a piezoceramic material. More specifically, in various embodiments, the piezo beam 14 comprises a piezo bimorph flexure beam. Although the flexure beam 14 is described herein as a piezoelectric beam including piezoelectric layers 74 and 78, the present disclosure should not be so limited. In various implementations, in lieu of piezoelectric layers 74 and 78, piezo fiber composite wafers, magnetostrictive or electrostrictive materials may also be employed and remain within the scope of the present disclosure.

In various embodiments, the substrate 82 includes a first flexure tab 86 at the first distal end 14A of the flexure beam 14, and a second flexure tab 90 at the second distal end 14B of the flexure beam 14. The first and second flexure tabs 86 and 90 are respectively coupled to the distal end 34A of the first tilt connector first lever arm 34 and the distal end 38B of the second tilt connector first lever arm 38.- The first and second flexure tabs 86 and 90 are suitably flexible to allow the flexure beam 14 to oscillate between, and beyond, a first bucked position (shown in solid lines in FIG. 1) and a second bucked position (shown in dashed lines in FIG. 1). The first bucked position illustrates a displacement $D^+$ of a center C of flexure beam 14, in a $Z^+$ direction, from a center line N between the first and second distal ends 14A and 14B of the flexure beam 14. The second bucked position illustrates an equal and opposite displacement $D^-$ of the center C, in a $Z^-$ direction, from the center line N. The flexure beam 14 can be bent or flexed to the first and second bucked positions by forces exerted on the flexure beam 14 by the bias beam 18, as described below. Moreover, when a voltage is applied across the flexure beam 14, as described further below, the displacement of the flexure beam 14 in the $Z^+$ and $Z^-$ directions is significantly greater than $D^+$ and $D^-$, produced by the bias beam 18 alone, due to a 'softening' of the flexure beam 14 by the forces exerted on the flexure beam 14 by the bias beam 18, as described below.

Referring now to FIGS. 1 and 2, in operation, generally, a voltage is applied across, i.e., a current flows through, the first piezoelectric layer 74 causing this first layer 74 to elongate, while substantially simultaneously, a reverse voltage is applied across the second piezoelectric layer 78 causing the second layer 78 to shorten. Thus, the flexure beam 14 is caused to controllably contort, i.e., bow or flex, resulting in the physical displacement of the center C of the flexure beam 14 in the $Z^+$ direction. The polarity of the applied voltages are cyclically alternated such that the center C of the flexure beam 14 oscillates between displacement in the $Z^+$ direction and displacement in the $Z^-$ direction. As used herein, the 'alternated polarity' will be understood to mean the cyclic alternation of the polarity of a DC voltage applied across the flexure beam 14 and the cyclic oscillation between positive and negative current associated with an AC voltage applied across the flexure beam 14. This oscillating displacement can be utilized to provide mechanical energy, or work. For example, the oscillating displacement can be used to drive a mechanical device 94, exemplarily illustrated in FIG. 1 as a piston of pneumatic or hydraulic device. Additionally, the motor 10 can be utilized for various applications such as hydraulic servo valves and active flow control systems for aircraft. In still other applications the flexure beam 14 itself can be used as a mechanical device, such as an elongated piston type device, without the need to be connected to a separate mechanical device 94.

However, the material characteristics of the flexure beam 14 require that a certain amount of electrical energy, i.e., voltage, be initially applied to overcome a critical buckling stress point of the flexure beam 14 before the flexure beam 14 can flex or bow beyond the critical buckling stress point of the flexure beam 14. The critical buckling stress point of the flexure beam 14 is defined as the point at which axial forces on the flexure beam 14 overcome the inherent bending stiffness of the flexure beam 14 and the flexure beam 14 begins to flex. As described in detail below, the bias beam 18 applies axial forces to the flexure beam 14 that assist the electrically generated force required to overcome the critical buckling stress point of flexure beam 14.

More specifically, the bias beam 18 provides a critical buckling load to the flexure beam 14. The critical buckling load is defined as the axial load applied by the bias beam 18 at the flexure beam distal ends 14A and 14B that causes the flexure beam 14 to flex to the critical buckling stress point. That is, the axial load applied to the flexure beam 14 above which the geometric induced moments $M_p$ on the flexure beam distal ends 14A and 14B, which tend to increase curvature of the beam, overcome the inherent bending stiffness of the flexure beam 14, which tends to decrease curvature. An axial load in excess of the critical buckling load will deform the flexure beam 14 to one of the two stable curved displacements on either side of the center line N, i.e., the first and second bucked positions, exemplarily illustrated in FIG. 1. The displacement $D^+$ is illustrative of a flexed stable displacement of the flexure beam 14 in the $Z^+$ direction, i.e., the first bucked position, and the displacement $D^-$ (shown in phantom) is illustrative a flexed stable displacement of the flexure beam 14 in the $Z^-$ direction, i.e., the second bucked position. As long as the stress on the flexure beam 14 is less than the elastic limit stress of the beam material, the process is revisable and with decreasing axial load the flexure beam will return to a straight condition. Thus, approximately all the electrical energy applied to the flexure beam 14 is utilized to produce displacement of the flexure beam center C beyond the first and second bucked positions $D^+$ and $D^-$.

In accordance with various embodiments, the motor 10 is configured such that the distances between the fulcrum points, e.g., the fulcrum arms 66 and 70, of the first and second tilt connectors 22 and 26, and the respective first and second legs 58 and 62, of the base 30, are adjustable, via adjusters 98. By adjusting the adjusters 98, the bias beam 18 can be flexed, or bowed, to exert a desired force on the distal end 42A of the first tilt connector second lever arm 42 in the $X^+$ direction. Simultaneously, the bias beam 18 exerts an equal and opposite force on the distal end 46B of the second tilt connector second lever arm 46 in the $X^-$ direction. Due to the pivotal nature of the first tilt connector 22 about the first pivot axles 66, the force in the $X^+$ direction on the first tilt connector second lever arm 42 generates equal and opposite force $X^-$ applied to the flexure beam first distal end 14A. Likewise, due to the pivotal nature of the second tilt connector 26 about the second pivot axle 70, the force in the $X^-$ direction on the second tilt connector second lever arm 46 generates equal and opposite force $X^+$ applied to the flexure beam second distal end 14B.

The adjusters 98 can be any suitable device that can either increase or decrease the longitudinal distance between the fulcrum points, e.g., the fulcrum arms 50 and 54, of the first and second tilt connectors 22 and 26. For example, in various embodiments, the adjusters 98 are nuts threaded onto threaded arms 66A and 70A of the respective first and second pivot axles 66 and 70. As described above, the first and second pivot axles 66 and 70 are adjustably carried, or retained, respectively by the base 30 first and second legs 58 and 62. By turning the nut adjusters 98, the position of the pivot axles 66 and/or 70 can be adjusted to move the respective first and/or second tilt connectors 22 and/or 26 closer to, or further away from the respective first and/or second legs 58 and/or 62 of the base 30. Accordingly, the force exerted by the bias beam 18 on the second lever arms 42 and 46 of the first and second tilt connectors 22 and 26, and consequently the force exerted by the first lever arms 34 and 38 of the first and second tilt connectors 22 and 26 on the first and second distal ends 14A and 14B of the flexure beam 14 can be increased or decreased by operation of the adjusters 98.

In accordance with various embodiments, the adjusters 98 are operated such that the force applied by the bias beam 18 to the first and second tilt connector second lever arms 42 and 46 is substantially equal to, or slightly greater than the critical buckling load, i.e., substantially equal to or slightly greater than the axial force required to be applied to the flexure beam 14 to reach the critical buckling stress point of the flexure beam 14. More specifically, when the motor 10 is in a static state, the bias beam 18 applies force to the flexure beam 14, via the first and second tilt connectors 22 and 26, to flex or bow and maintain the flexure beam 14 in one of the two stable states, i.e., the first and second bucked positions $D^-$ or $D^+$, that are at, or slightly beyond the critical buckling stress point of the flexure beam 14. Therefore, the force provided by the bias beam 18 'softens' the flexure beam 14 to the critical buckling stress point, or slightly beyond, so that approximately all the electrical energy applied to the flexure beam 14 is utilized to displace the center C of the flexure beam 14 beyond the displacement of the flexure beam 14 at the critical buckling stress point, i.e., beyond the first bucked position (at $D^+$) and the second bucked position (at $D^-$). Accordingly, the force required to oscillate the flexure beam 14 between the first and second bucked positions $D^-$ and $D^+$, and beyond, is significantly reduced such that the motor 10 will operate with significantly increased efficiency.

The adjusters 98 are adjusted such that, in operation, the amount of curvature of the flexure beam 14 is set so that the piezoelectric induced moments $M_p$ on the flexure beam distal ends 14A and 14B have sufficient authority to switch between stable conditions, i.e., the first and second bucked positions $D^-$ and $D^+$, without exceeding the elastic limit of the flexure beam material. If the piezoelectric induced moments $M_p$ applied are greater than required to switch stable conditions, i.e., the first and second bucked positions $D^-$ and $D^+$, the flexure beam 14 will only have one stable condition. Since the flexure beam 14 is operating in the post buckled condition the piezoelectric induced moment, the piezoelectric induced moments $M_p$ required to oscillate the flexure beam 14 between the first and second bucked positions $D^-$ and $D^+$, and beyond, is significantly less than that required to oscillate with similar amounts of displacement if the flexure beam 14 did not have the axial load applied by the bias beam 18, as described above.

Accordingly, softening the flexure beam 14, as described above, allows the applied voltage to produce significantly larger displacements beyond the first and second bucked positions $D^+$ and $D^-$ than simple, conventional piezo flexures unassisted by any biasing force. For example, the peak to peak distance between the oscillating displacements beyond the first and second bucked positions of the flexure beam 14 can be ten to twenty times that obtained with simple, conventional piezo flexures unassisted by any biasing force. Therefore, the energy delivered to a load, e.g., the mechanical device 94, is also significantly increased.

It should be noted that, in accordance with various embodiments, the axial stiffness of the bias beam 18 is substantially equal to or slightly greater than that of the flexure beam 14.

Figure 3:
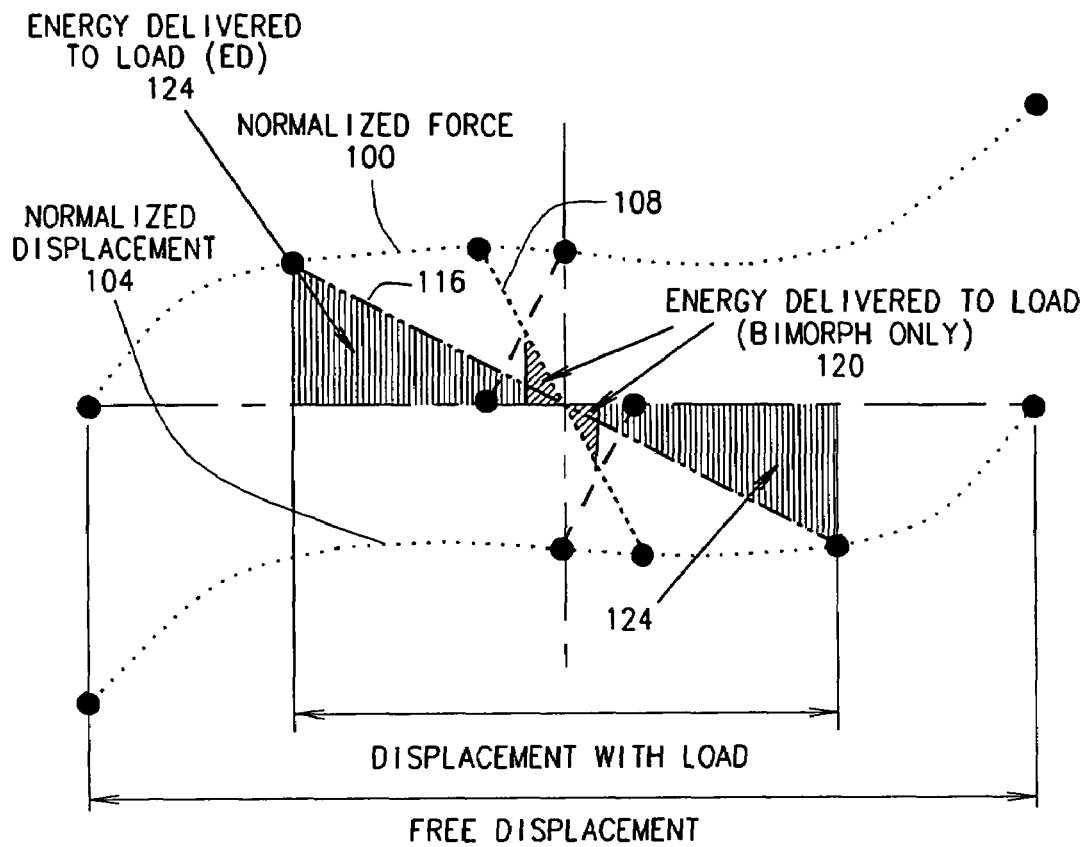
FIG. 3 is a graphical representation of empirical data illustrating an increased energy delivered by the motor shown in FIG. 1, in accordance with various embodiments.
Figure 3A:
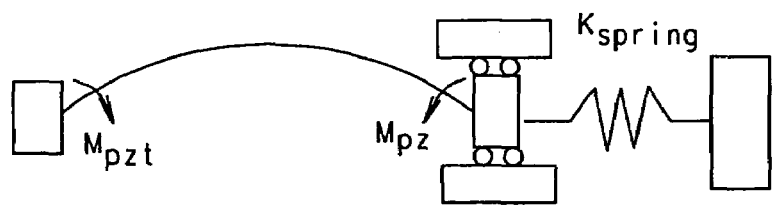
FIG. 3A is block diagram of a typical piezoelectric bimorph beam without the enhanced displacement provided by motor shown in FIG. 1.

Referring now to FIG. 3, a graphical representation of empirical data illustrating the significant increase in energy delivered by the motor 10, due to the enhanced displacement (ED) of the flexure beam 14, is provided. The x-axis is the normalized motor displacement and the y-axis is the normalized force produced by the motor. Curve 100 is illustrative of the normalized force delivered by the flexure beam 14 of the motor 10 with maximum applied voltage. The curve 104 is illustrative of the normalized displacement of the flexure beam 14 of the motor 10 with minimum applied voltage. The line 108 is illustrative of the bimorph load line, i.e., the force-displacement curve of the mechanical load the motor 10 is driving. The line 116 is illustrative of the maximum-work load line for the motor 10. The shaded areas 120 are illustrative of energy delivered by a typical piezoelectric bimorph beam without the enhanced displacement provided by motor 10, such as that illustrated in FIG. 3A. The significantly larger shaded areas 124 are illustrative of the energy delivered by the enhanced displacement motor 10.

It should be readily understood by one skilled in the art that during operation of the motor 10, as described above, the bias beam 18 will also be oscillating between a first flexed position and a substantially straight position. This oscillating displacement of bias beam 18 can also be utilized to provide mechanical energy, or work. The mechanical energy provided by the bias beam 18 can be utilized in the same or substantially similar manner, applications, and methods as described above with regard to utilizing the oscillation of the flexure beam 14 to provide mechanical energy, or work.

Figure 4:
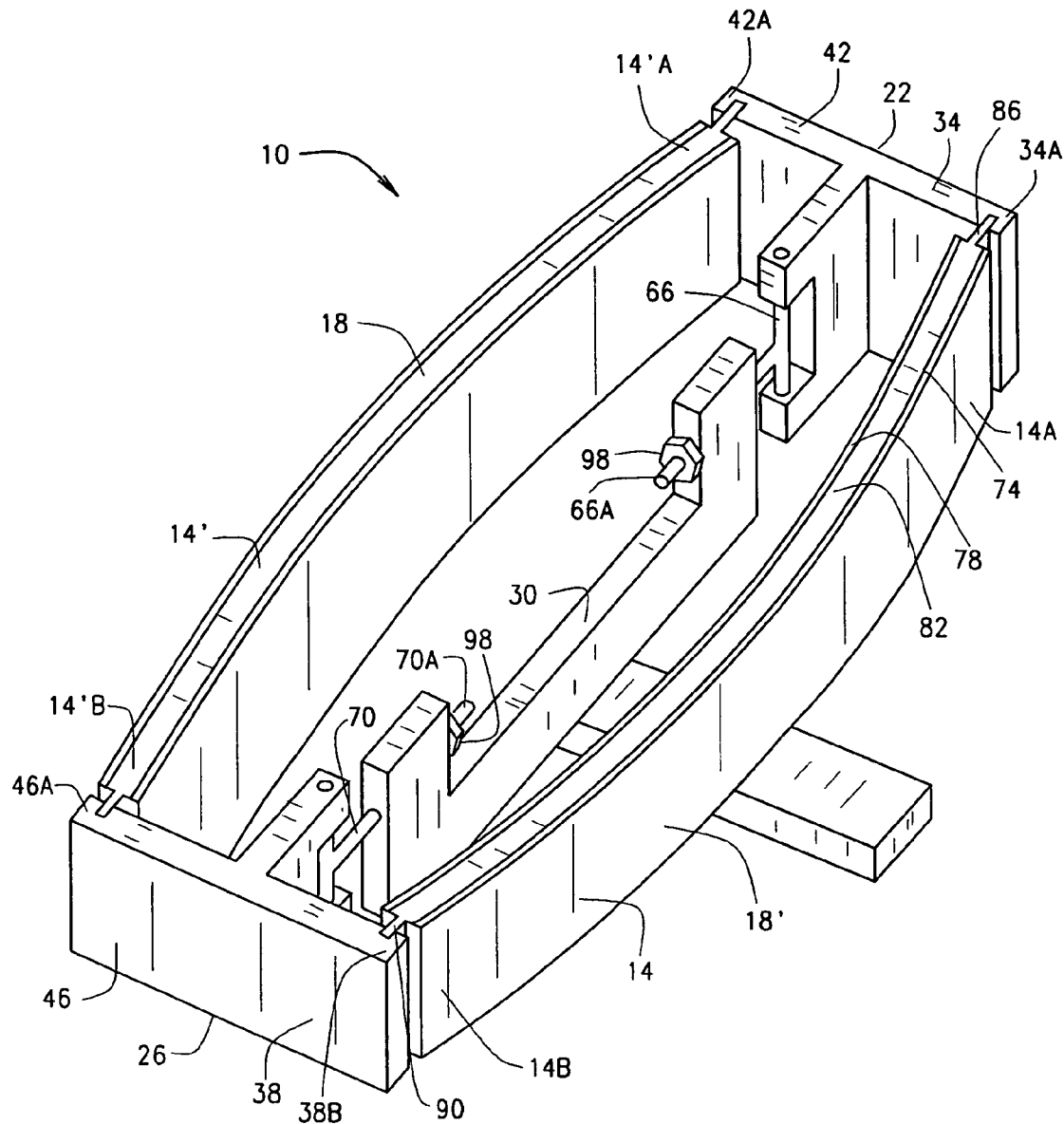
FIG. 4 is an isometric view of the motor, shown in FIG. 1, including the first flexure beam and a second flexure beam, in accordance with various embodiments.

Referring now to FIG. 4, in various embodiments, the bias beam 18 can comprise a second flexure beam 14' substantially similar to the flexure beam 14. In which case, as the second flexure beam 14' transitions from deflection in the $Z^-$ direction to deflection in the reverse $Z^+$ direction, as described above with regard to flexure beam 14, the second flexure beam 14' acts as the bias beam 18, as described above. Similarly, as the flexure beam 14 transitions from deflection in the $Z^+$ direction to deflection in the $Z^-$ reverse direction, the flexure beam 14 acts as the bias beam 18', as described above with regard to the bias beam 18. Thus, the second flexure beam 14' will oscillate in substantially the same manner and simultaneously with, but 180° out of phase with, the flexure beam 14. Accordingly, the oscillating displacement of the second flexure beam 14' can also be utilized to provide mechanical energy, or work. The mechanical energy provided by the second flexure beam 14' can be utilized in the same or substantially similar manner, applications, and methods as described above with regard to the flexure beam 14.

A significant benefit of the motor 10 is that it can be used over a much wider frequency bandwidth than known resonate type piezoelectric motors, particularly, the motor 10 is very effective and efficient at providing useful work at frequencies below the resonant frequency of the flexure beam 14. Typical flexure beams of known piezoelectric motors cannot run below the resonant frequency of the beam because the amplitude, i.e., displacement, of the oscillation has very little amplitude and therefore, is generally unable to provide any useful work. Typical piezoelectric motors are 'tuned' to operate at the resonant frequency, and if the motor is run off-resonance, the amplitude of oscillation is significantly reduced. However, the motor 10, including the bias beam 18 and the flexure 14, as described above, can provide a significant amount of useful work at frequencies equal to, above and below the resonant frequency. That is, the motor 10 provides large oscillation displacements of the flexure 14 across a broad band of frequencies. Thus, the motor 10 provides enhanced displacement over a broad band of frequencies, without having to be tuned to a single resonant frequency.

Figure 5:
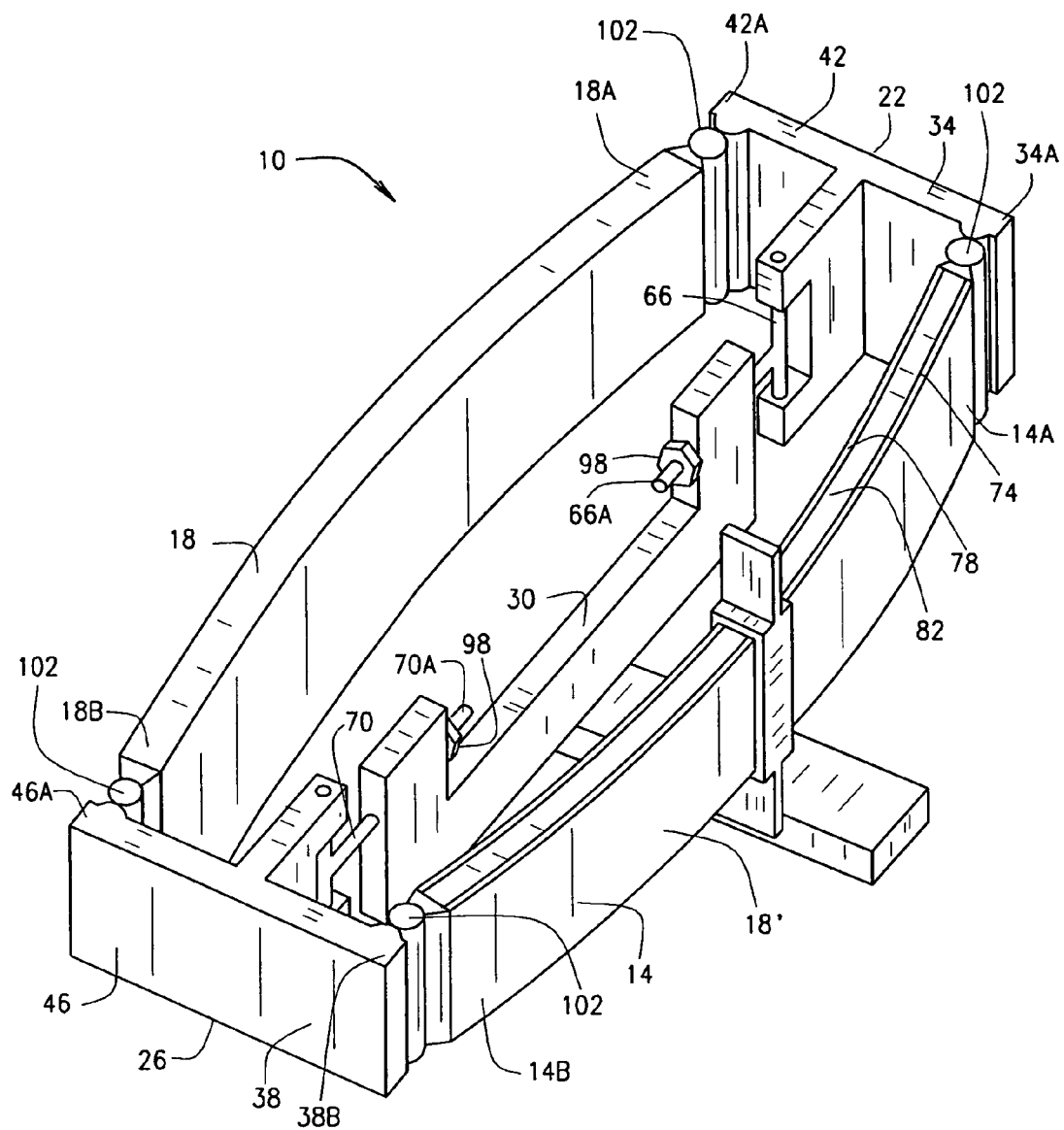
FIG. 5 is an isometric view of the motor, shown in FIG. 1, including roller pins at opposing distal ends, in accordance with various embodiments.

Although the flexure beam 14 is illustrated as being connected to the first and second tilt connectors 22 and 26 by flexure tabs extending from the substrate 82, it should be understood that any other connection means suitable to allow the flexure beam 14 to reciprocate between the displacement in the $D^-$ and the $D^+$ directions can be employed. For example, as illustrated in FIG. 5, a roller pin 102 can be affixed to the distal ends 14A and 14B of the flexure beam 14, wherein the roller pins 102 are rotatably cooperative with, or connected to, the respective first and second tilt beams 22 and 26. Such an exemplary flexure beam with roller pins affixed to the distal ends is described in a copending and concurrently filed patent application having attorney docket number 7784-000964, titled Electrical-To-Mechanical Transducer Apparatus And Method, and assigned to The Boeing Company, as is the present patent application, the disclosure of which is herein incorporated by reference. Additionally, the bias beam 18 can be fabricated in the same manner as the flexure beam 14 to include a roller pin 102 affixed to the distal ends 18A and 18B, wherein the roller pins 102 are rotatably cooperative with, or connected to, the respective first and second tilt beams 22 and 26. In various embodiments, the roller pins 102 can include one or more nubs 104 (shown in phantom in FIG. 6), e.g., semispherical protrusions. When the motor 10 is assembled, the nubs 104 cooperatively fit within mating recesses (not shown) in the respective first and second lever arms 34, 38, 42 and 46 of the first and second tilt connectors 22 and 26. The cooperative mating of the nubs 104 within the recesses provides a very small surface area of contact between the roller pins 102 and the first and second tilt connectors 22 and 26. Moreover, the very small surface area of contact provides a very low friction bearing surface between the roller pins 102 and the first and second tilt connectors 22 and 26 that allows the roller pins 102 to pivot, or rotate, at the tilt connector lever arm distal ends 34A and 38B with very little frictional resistance.

Figure 6:
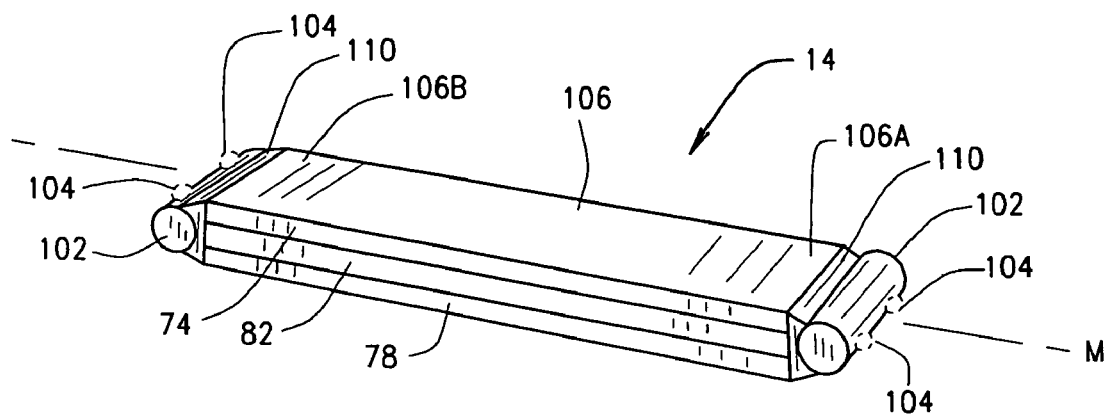
FIG. 6 is an isometric view of a piezoelectric bimorph beam included in the piezoelectric motor shown in FIG. 5, in accordance with various embodiments.

Referring now to FIG. 6, as set forth above, in various embodiments, the flexure beam 14 can be a piezo bimorph flexure beam comprising a filled carbon substrate 82 sandwiched between the two piezoelectric layers 74 and 78. As also set forth above, in various embodiments, the flexure beam 14 can be rotatably cooperative with, or connected to, the first and second tilt connectors 22 and 26 via roller pins 102. FIG. 6 illustrates a piezoelectric flexure beam 14 including the roller pins 102, in accordance with various embodiments. In such embodiments, the flexure beam 14 includes a piezoelectric body 106 and the roller pins 102 affixed to distal ends 106A and 106B of the body 106 via roller pin mounts 110. The roller pins can be fabricated from any material that can withstand reciprocating, cooperative action of the roller pins 102 with the respective tilt connector ends 22 and 26. For example, in various embodiments, the roller pins 102 are fabricated from a metal, e.g., stainless steel. Additionally, the roller pin mounts 110 can be fabricated of any suitable material suitable to substantially permanently affix the roller pins 102 to the distal ends 106A and 106B of the body 106. For example, in various embodiments, the roller pin mounts 110 can be fabricated from an epoxy or a plastic composite. As described further below, in various embodiments, the roller pin mounts 110, and more specifically, the flexure beam 14, can be fabricated using an injection molding process or method.

Figure 7:
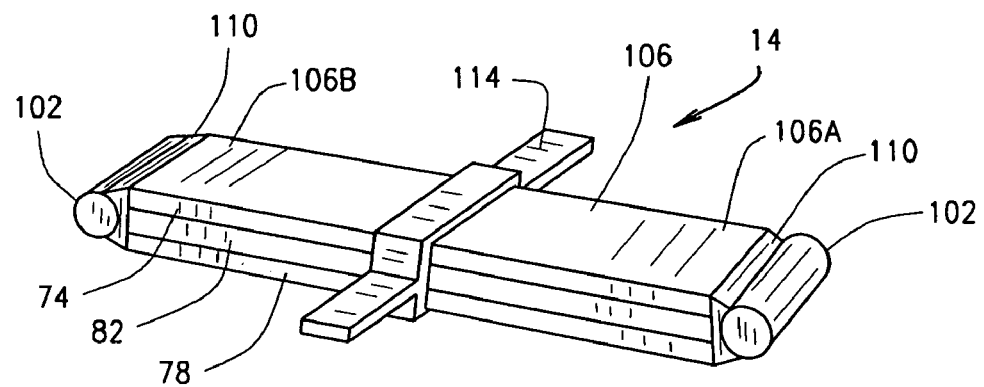
FIG. 7 is an isometric view of the piezoelectric bimorph beam shown in FIG. 6, including a mounting tab, in accordance with various embodiments.

Referring now to FIG. 7, in various implementations, the flexure beam 14 includes a mounting tab 114 positioned around a center portion of the body 106. The mounting tab 114 can be used to connect the mechanical device 94 to the flexure beam 14 of the motor 10. However, it is envisioned that the flexure beam 14 can be fabricated, as described herein, and also utilized in a vibration energy harvester (VEH), such as the VEH described the copending and concurrently filed patent application, attorney docket number 7784-000964, titled Electrical-To-Mechanical Transducer Apparatus And Method, described above and incorporated by reference herein. In such VEH implementations, the mounting tab 114 can be used to connect the flexure beam 14 to a vibrating structure. The mounting tab 114 can be fabricated of any suitable material suitable for withstanding the reciprocating displacements of the flexure beam 14. For example, in various embodiments, the mounting tab 114 can be fabricated from an epoxy or a filled plastic composite, e.g., fiberglass. As described further below, in various embodiments, the mounting tab 114 and roller pin mounts 110, and more specifically, the flexure beam 14, can be fabricated using an injection molding process or method.

Although compressive axial force on the flexure beam 14 has been described and illustrated as being provided by the cooperative operation of the bias beam 18 and the first and second tilt connectors 22 and 26, other means of applying a compressive axial force to the distal ends 14A and 14B of the flexure beam can be employed and remain within the scope of the present disclosure. For example, forces could be applied in the X$^-$ and X$^+$ direction to external sides of the first and second tilt connector first lever arms 34 and 38, i.e., the opposite side of the respective lever arms 34 and 38 from the flexure beam 14. Such externally applied forces would also provide a compressive axial force to the flexure beam 14 sufficient to soften the flexure beam 14 and enable the enhanced displacement, as described above. Alternatively, a contracting biasing device could be connected to internal sides of the of the first and second tilt connector first lever arms 34 and 38, i.e., the same side of the respective lever arms 34 and 38 as the flexure beam 14. Such a contracting bias device would also apply forces to the lever arms 34 and 38 in the X$^-$ and X$^+$ direction that would provide a compressive axial force to the flexure beam 14 sufficient to soften the flexure beam 14 and enable the enhanced displacement, as described above.

Figure 8:
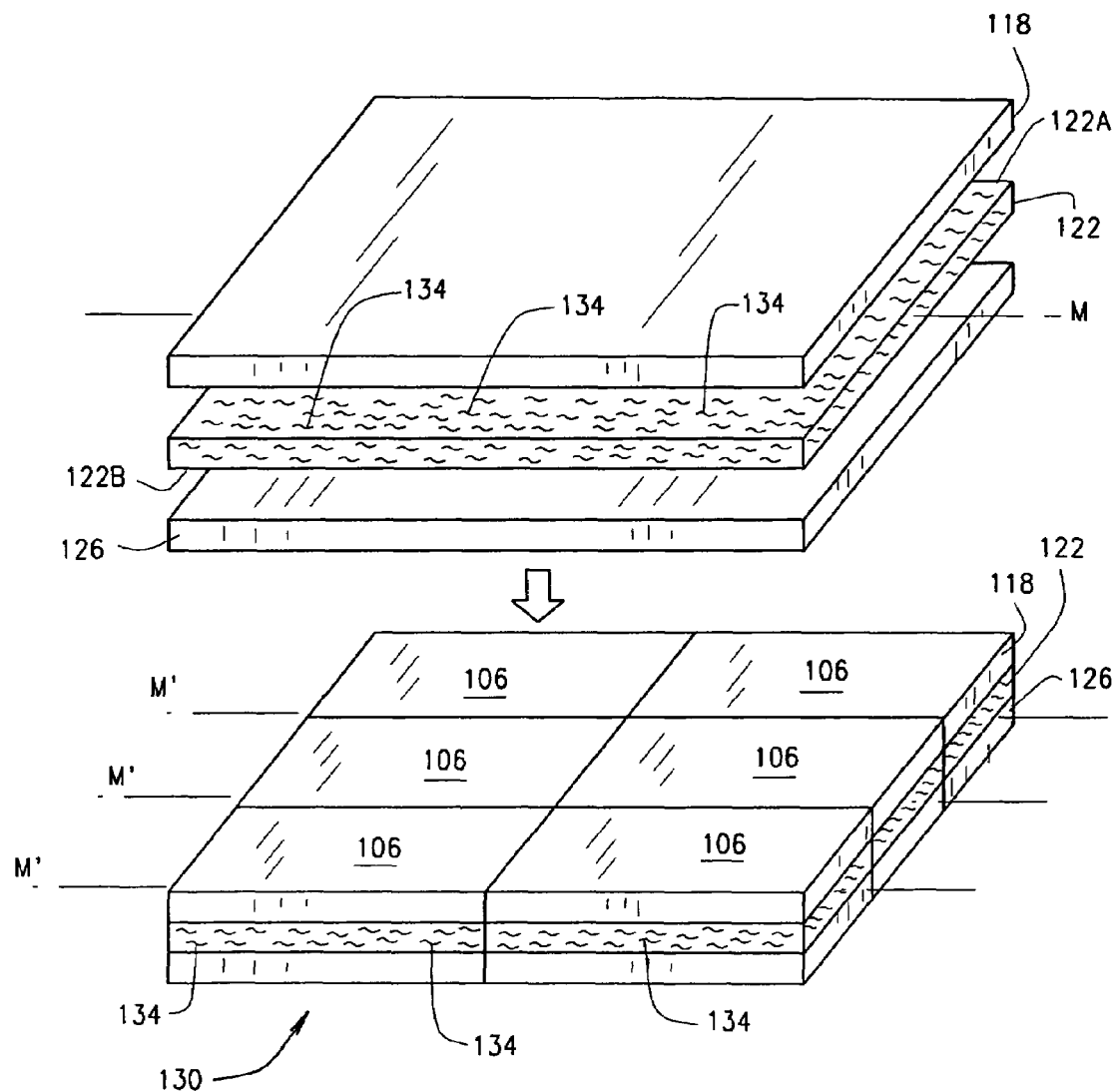
FIG. 8 is an isometric view of a piezoelectric bimorph slab fabricated in accordance with various embodiments.

Referring now to FIG. 8, a method of fabricating the piezoelectric bimorph body 106 will now be described. In accordance with various embodiments, the piezoelectric body 106 can be fabricated in mass, i.e., a plurality of bodies 106 can be fabricated substantially at the same time. In such embodiments, a first piezoelectric wafer 118 is substantially permanently affixed to a first surface 122A of a flexible substrate wafer 122 and a second piezoelectric wafer 126 is affixed to an opposing second surface 122B of the flexible substrate wafer 122 to form a piezoelectric bimorph slab 130. The first and second piezoelectric wafers 118 and 126 can be affixed to the flexible substrate wafer 122 using any suitable means such as gluing or using a hot press. In various implementations, the first and second piezoelectric wafers 118 and 126 are piezoceramic wafers. Additionally, in various implementations, the flexible substrate wafer 122 is manufactured using a fiber filled composite. More specifically, in various embodiments, the flexible substrate wafer 122 consists of a uniaxle carbon fiber composite preimpregnated with carbon fibers 134. The preimpregnated carbon fibers 134 of uniaxle carbon fiber composite substrate wafer 122 are oriented within the substrate wafer 122 such that they all align with, or are oriented substantially parallel with, an longitudinal axis M of the substrate wafer 122.

Once the piezoelectric bimorph slab 130 is fabricated, the slab 130 is subdivided into a plurality of piezoelectric bimorph bars, wherein each bar constitutes a respective piezoelectric body 106 having the flexible supporting substrate 82 sandwiched between the first and second piezoelectric layers 74 and 78. In the embodiments wherein the flexible substrate wafer 122 is a preimpregnated uniaxle carbon fiber composite substrate, the bimorph slab 130 is subdivided into a plurality of bimorph bodies 106 such that the carbon fibers 134 align with, or are oriented substantially parallel with, an longitudinal axis M' of each body 106. Having the carbon fibers 134 oriented in alignment with the longitudinal axis M' of each body 106 adds considerable strength and flexing durability to each body 106.

Referring now to FIGS. 9 and 10, a method of manufacturing the flexure beams 14, e.g., the piezoelectric bimorph flexure beams, will now be described. In accordance with various embodiments, the flexure beams 14 including the roller pins 102 can be fabricated, or manufactured, using an injection molding process. In such embodiments, the roller pins 102 and the body 106 are inserted into a first half 138 of an exemplary injection mold form. For simplicity and clarity, only the first half 138 of the exemplary injection mold form is illustrated in FIGS. 9 and 10. However, it should readily be understood that the exemplary injection mold form would also include a second half (not shown) that is a mirror image of the first half 138.

Referring particularly to FIG. 9, once the roller pins 102 and the body 106 are inserted into the injection mold form first half 138, the mold form second half (not shown) is placed on top of the first half 138, thereby enclosing, or encapsulating, the roller pins 102 and body 106 within the assembled mold form. As is clearly illustrated in FIG. 9, and readily understood by the skilled artisan, roller pin cavities 142 will be formed between the enclosed roller pins 102 and the distal ends 106A and 106B of the enclosed body 106. A liquefied substance is then injected into the mold form to fill the cavities 142. The physical properties of the liquefied substance are such that once injected into the cavities 142, the liquefied substance will solidify, cure and/or harden to substantially permanently affix the roller pins 102 to the distal ends 106A and 106B of the body 106. The liquefied substance can be any liquefied substance suitable for injecting into the mold form and that will solidify, cure and/or harden within the mold to substantially permanently affix the roller pins 102 to the distal ends 106A and 106B of the body 106. For example, in various embodiments, the liquefied substance is a molten fiber filled plastic such as fiberglass.

Referring particularly to FIG. 10, in various embodiments, the injection mold form first half 138 and second half (not shown) additionally include a mounting tab cavity 146. As is clearly illustrated in FIG. 9, and readily understood by the skilled artisan, the mounting tab cavity 146 will be formed around a center section of the enclosed piezoelectric body 106. In such embodiments, the liquefied substance injected into the mold form will also fill the mounting tab cavity 146, and subsequently solidify, cure and/or harden to form the mounting tab 114. Alternatively, a second liquefied substance having different physical characteristics than the liquefied substance injected into the roller mount cavities 142 can be injected into the mount tab cavity 146. For example, the second liquefied substance may solidify, cure and/or harden to less rigid, more flexible state than the solidified, cured and/or hardened first liquefied substance, or vice-versa.

Referring again to FIGS. 9 and 10, it should be readily understood that the injection mold form(s) partially shown in FIGS. 9 and 10 is/are merely exemplary and the scope of the present disclosure should not be so limited. Particularly, any other injection mold form(s) suitable for inserting the roller pins 102 and the body 106 prior to injecting the liquefied substance(s) is within the scope of the present disclosure.

The description herein is merely exemplary in nature and, thus, variations that do not depart from the gist of that which is described are intended to be within the scope of the teachings. Such variations are not to be regarded as a departure from the spirit and scope of the teachings.

What is claimed is:

1. A mechanical energy generating apparatus comprising:
   a shape changing flexure beam connected at a first distal end to a first lever arm of a first tilt connector and connected at an opposing second distal end to a first lever arm of a second tilt connector;
   a bias beam connected at a first distal end to a second lever arm of the first tilt connector and connected at an opposing second distal end to a second lever arm of the second tilt connector; and
   a base pivotally connected to the first and second tilt connectors such that a distance between the first and second tilt connectors is such that the bias beam is flexed to exert a force on the second lever arms of the first and second tilt connectors that is transferred to the first lever arms of the first and second tilt connectors to flex the flexure beam to approximately a critical buckling stress point of the flexure beam;
   the flexure beam having a center portion configured to oscillate between a first displacement position beyond the critical buckling stress point in a first direction and a second displacement position beyond the buckling stress point in the an opposing second direction in response to an oscillating energy field applied across the flexure beam.

2. The apparatus of claim 1, wherein the flexure beam comprises a bimorph piezoelectric flexure beam and the oscillating energy field comprises an alternating polarity voltage applied across the flexure beam.

3. The apparatus of claim 1, wherein the flexure beam comprises at least one layer of an electrostrictive materials and the oscillating energy field comprises an alternating polarity voltage applied across the flexure beam.

4. The apparatus of claim 1, wherein the flexure beam comprises at least one layer of a magnetostrictive material and the oscillating energy field comprises an alternating polarity magnetic field applied across the flexure beam.

5. The apparatus of claim 1, wherein the flexure beam comprises a first flexure beam and the bias beam comprises a second flexure beam configured to operate as the bias beam for the first flexure beam and as a second flexure beam operating 180° out of phase with the first flexure beam such that the first flexure beam also operates as a bias beam for the second flexure beam.

6. The apparatus of claim 1, wherein the flexure beam comprises a first flexure tab extending from the first distal end and a second flexure tab extending from the second distal end, the first and second flexure tabs structured to pivotally connect the flexure beam to the respective first and second tilt connectors.

7. The apparatus of claim 1, wherein the flexure beam comprises a first roller pin affixed to the first distal end and a second roller pin affixed to the second distal end, the first and second roller pins structured to pivotally connect the flexure beam to the respective first and second tilt connectors.

8. The apparatus of claim 1, wherein the apparatus further comprises a first pivot axle adjustably extending from a first distal end of the base to pivotally connect the first tilt connector to the base and a second pivot axle adjustably extending from a second distal end of the base to pivotally connect the second tilt connector to the base, an extension distance of the first and second pivot axles adjustable to adjust the distance between the first and second tilt connectors.

9. A mechanical energy generating apparatus comprising:
   a first tilt connector including a first lever arm, a second lever arm and a fulcrum arm;
   a second tilt connector including a first lever arm, a second lever arm and a fulcrum arm;
   a shape changing flexure beam connected at a first distal end to the first lever arm of the first tilt connector and connected at an opposing second distal end to the first lever arm of the second tilt connector;
   a bias beam connected at a first distal end to the second lever arm of the first tilt connector and connected at an opposing second distal end to the second lever arm of the second tilt connector; and
   a base pivotally connected at a first distal end to the first tilt connector fulcrum arm and pivotally connected at an opposing second distal end to the second tilt connector fulcrum arm such that a distance is maintained between the first and second tilt connectors that causes the bias beam to flex and exert a force on the second lever arms of the first and second tilt connectors that is transferred to the first lever arms of the first and second tilt connectors that causes the flexure beam to flex to approximately a critical buckling stress point so that approximately all energy used to apply a voltage across the flexure beam is utilized to produce displacement of a center of the flexure beam beyond the critical buckling stress point;
   the polarity of the voltage across the flexure beam cyclically alternateable to oscillate the center of the flexure beam between a first displacement position beyond the critical buckling stress point in a first direction and a second displacement position beyond the buckling stress point in an opposing second direction, the oscillation of the center of the flexure beam adapted to generate mechanical energy deliverable to a mechanical device connectable to the flexure beam.

10. The apparatus of claim 9, wherein the flexure beam comprises one of:
    a bimorph piezoelectric flexure beam having two layers of piezoelectric material and the oscillating energy field comprises an alternating polarity voltage applied across the flexure beam;
    an electrostrictive flexure beam having at least one layer of an electrostrictive material and the oscillating energy field comprises an alternating polarity voltage applied across the flexure beam; and
    a magnetostrictive flexure beam having at least one layer of a magnetostrictive material and the oscillating energy field comprises an alternating polarity magnetic field applied across the flexure beam.

11. The apparatus of claim 9, wherein the flexure beam comprises a first flexure beam and the bias beam comprises a second flexure beam configured to operate as the bias beam for the first flexure beam and as a second flexure beam operating 180° out of phase with the first flexure beam such that the first flexure beam also operates as a bias beam for the second flexure beam.

12. The apparatus of claim 9, wherein the flexure beam comprises a first flexure tab extending from the first distal end and a second flexure tab extending from the second distal end, the first and second flexure tabs structured to pivotally connect the flexure beam to the respective first and second tilt connectors.

13. The apparatus of claim 9, wherein the flexure beam comprises a first roller pin affixed to the first distal end and a second roller pin affixed to the second distal end, the first and second roller pins structured to pivotally connect the flexure beam to the respective first and second tilt connectors.

14. The apparatus of claim 9, wherein the apparatus further comprises a first pivot axle adjustably extending from a first distal end of the base to pivotally connect the first tilt connector to the base and a second pivot axle adjustably extending from a second distal end of the base to pivotally connect the second tilt connector to the base, an extension distance of the first and second pivot axles adjustable to adjust the distance between the first and second tilt connectors in order to flex the flexure beam to approximately the critical buckling stress point.

15. A method for generating mechanical energy using a piezoelectric motor, said method comprising:
pivotally connecting a first distal end of a piezoelectric flexure beam to a first lever arm of a first tilt connector and pivotally connecting at an opposing second distal end to a first lever arm of the second tilt connector;
pivotally connecting a first distal end of a bias beam to a second lever arm of the first tilt connector and pivotally connecting at an opposing second distal end to a second lever arm of the second tilt connector;
pivotally connecting a base to the first and second tilt connectors;
adjusting a distance between the first and second tilt connectors to cause the bias beam to flex and exert a force on the second lever arms of the first and second tilt connectors that is transferred to the first lever arms of the first and second tilt connectors that causes the flexure beam to flex to approximately a critical buckling stress point of the flexure beam so that approximately all energy used to apply a voltage across the flexure beam is utilized to produce displacement of a center of the flexure beam beyond the critical buckling stress point;
oscillating the voltage across the flexure beam to oscillate a center of the flexure beam between a first displacement position beyond the critical buckling stress point in a first direction and a second displacement position beyond the buckling stress point in the an opposing second direction, the oscillation of the center of the flexure beam generating mechanical energy deliverable to a mechanical device connectable to the flexure beam.

16. The method of claim 15 further comprising oscillating the voltage across the flexure beam at a frequency below a resonant frequency of the flexure beam.

17. The method of claim 15, wherein the flexure beam comprises a first flexure beam and the bias beam comprises a second flexure beam and the method further comprises:
utilizing the second flexure beam as the bias beam for the first flexure beam; and
utilizing the first flexure as a second bias beam to operate the second flexure beam 180° out of phase with the first flexure beam.

18. The method of claim 15, wherein:
pivotally connecting the first distal end of the piezoelectric flexure beam to the first lever arm of the first tilt connector comprises connecting a first flexure tab extending from the first distal end of the flexure beam to the first lever arm of the first tilt connector; and
pivotally connecting the opposing second distal end to a first lever arm of the second tilt connector the flexure beam comprises connecting a second flexure tab extending from the second distal end of the flexure beam to the first lever arm of the second tilt connector.

19. The method of claim 15, wherein:
pivotally connecting the first distal end of a piezoelectric flexure beam to the first lever arm of the first tilt connector comprises pivotally connecting a first roller pin affixed to the first distal end of the flexure beam to the first lever arm of the first tilt connector; and
pivotally connecting the opposing second distal end to the first lever arm of the second tilt connector comprises pivotally connecting a second roller pin affixed to the second distal end of the flexure beam to the first lever arm of the second tilt connector.

20. The method of claim 15, wherein a first adjustable pivot axle extends from a first distal end of the base to pivotally connect the first tilt connector to the base and a second adjustable pivot axle extends from a second distal end of the base to pivotally connect the second tilt connector to the base, and wherein adjusting the distance between the first and second tilt connectors comprises adjusting an extension distance of the first and second pivot axles to adjust the distance between the first and second tilt connectors in order to flex the flexure beam to approximately the critical buckling stress point.

21. A mechanical energy generating apparatus comprising:
a shape changing flexure beam cooperatively coupled with a bias device adapted to apply an axial compressive force to opposing distal ends of the flexure beam that is greater than a critical buckling force of the flexure beam to soften the flexure beam such that the flexure beam flexes back and forth between two stable positions on opposite sides of a centerline extending longitudinally between the two stable positions, and such that electrical signals applied to the flexure beam produce enhanced displacement of a center of the flexure beam beyond a critical buckling stress point of the flexure beam and the apparatus is operable at frequencies below the resonant frequency of the flexure beam.

22. A mechanical energy generating apparatus comprising:
a shape changing flexure beam having an electrically responsive material, and first and second distal ends;
a biasing beam operatively coupled to the first and second distal ends of the flexure beam, and being laterally offset from the flexure beam, to exert a biasing force that softens the flexure beam and flexes the flexure beam beyond a critical buckling stress point, to enhance flexing motion of the flexure beam between two stable positions on opposite sides of a centerline in response to an oscillating energy field applied across the flexure beam, and the centerline extending longitudinally between the two stable positions.

* * * * *